(12) United States Patent
Sueoka et al.

(10) Patent No.: US 10,903,526 B2
(45) Date of Patent: Jan. 26, 2021

(54) ELECTRON DEVICE STACK STRUCTURE (71) Applicant: INTERNATIONAL BUSINESS MACHINES CORPORATION, Armonk, NY (US)

(72) Inventors: Kuniaki Sueoka, Sagamihara (JP); Akihiro Horibe, Yokohama (JP); Risa Miyazawa, Isehara (JP)

(73) Assignee: International Business Machines Corporation, Armonk, NY (US)

(*) Notice: Subject to any disclaimer, the term of this patent is extended or adjusted under 35 U.S.C. 154(b) by 244 days.

(21) Appl. No.: 16/206,371

(22) Filed: Nov. 30, 2018

(65) Prior Publication Data
US 2020/0176821 A1 Jun. 4, 2020

(51) Int. Cl.
*H01M 10/0585* (2010.01)
*C23C 14/54* (2006.01)
*C23C 14/34* (2006.01)
*H01M 2/20* (2006.01)

(52) U.S. Cl.
CPC ......... *H01M 10/0585* (2013.01); *C23C 14/34* (2013.01); *C23C 14/542* (2013.01); *H01M 2/204* (2013.01)

(58) Field of Classification Search
None
See application file for complete search history.

(56) References Cited

U.S. PATENT DOCUMENTS

| 2016/0099175 | A1 | 4/2016 | Horibe et al. |
| 2016/0126019 | A1* | 5/2016 | Lindstrom .......... H01L 51/0032 136/263 |
| 2017/0301954 | A1 | 10/2017 | Kwak et al. |
| 2017/0323710 | A1* | 11/2017 | Kim .......... H01Q 1/38 |
| 2018/0083304 | A1* | 3/2018 | Horibe .......... H01M 4/131 |
| 2018/0315965 | A1* | 11/2018 | Fallourd .......... H01M 10/0436 |

FOREIGN PATENT DOCUMENTS

WO 2015023510 A1 2/2015

* cited by examiner

Primary Examiner — Wyatt P McConnell
(74) Attorney, Agent, or Firm — Tutunjian & Bitetto, P.C.; Randall Bluestone (57) ABSTRACT

A method for fabricating an electron device stack structure includes preparing plural substrates, each having a corresponding one of plural vias; sputter-depositing plural metal layers on the plural substrates to form plural electron device layers, each of the plural metal layers being sputter-deposited on a corresponding one of the plural substrates and including a part straying into a corresponding one of the plural vias as a corresponding one of plural stray metal portions; stacking the plural electron device layers to construct the electron device stack structure having a conductive path formed by connecting the plural vias; and injecting a conductive material into the conductive path to form a vertical electrical connection among the plural stray metal portions.

8 Claims, 11 Drawing Sheets

ELECTRON DEVICE STACK STRUCTURE

BACKGROUND

Technical Field

The present invention generally relates to electron device technology and, more particularly, to an electron device stack structure and a fabricating method thereof.

Description of the Related Art

An electron device stack structure has various advantages. Assuming that the electron device stack structure is a battery stack structure, for example, the advantages include increased capacity and lower internal impedance. Thus, a method for fabricating the electron device stack structure at a low cost is required.

SUMMARY

According to an embodiment of the present invention, there is provided a method for fabricating an electron device stack structure. The method includes preparing plural substrates each having a corresponding one of plural vias. The method further includes sputter-depositing plural metal layers on the plural substrates to form plural electron device layers, each of the plural metal layers being sputter-deposited on a corresponding one of the plural substrates and including a part straying into a corresponding one of the plural vias as a corresponding one of plural stray metal portions. The method further includes stacking the plural electron device layers to form the electron device stack structure having a conductive path formed by connecting the plural vias. The method further includes injecting a conductive material into the conductive path to form a vertical electrical connection among the plural stray metal portions.

According to another embodiment of the present invention, there is provided an electron device stack structure including plural substrates, plural metal layers, and a conductive material. The plural substrates each have a corresponding one of plural vias. The plural metal layers are deposited on the plural substrates to form plural electron device layers, each of the plural metal layers being deposited on a corresponding one of the plural substrates and including a part straying into a corresponding one of the plural vias as a corresponding one of plural stray metal portions, the plural electron device layers being stacked to form the electron device stack structure having a conductive path formed by connecting the plural vias. The conductive material is injected into the conductive path to form a vertical electrical connection among the plural stray metal portions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Hereinafter, exemplary embodiments of the present invention will be described in detail with reference to the attached drawings.

It is to be noted that the present invention is not limited to these exemplary embodiments to be given below and can be implemented with various modifications within the scope of the present invention. In addition, the drawings used herein are for purposes of illustration, and may not show actual dimensions.

First, an explanation is given of a fabrication of an electron device stack structure according to an exemplary embodiment. Note that the electron device stack structure can include an electron device such as an integrated circuit (IC) chip or the like.

Figure 1:
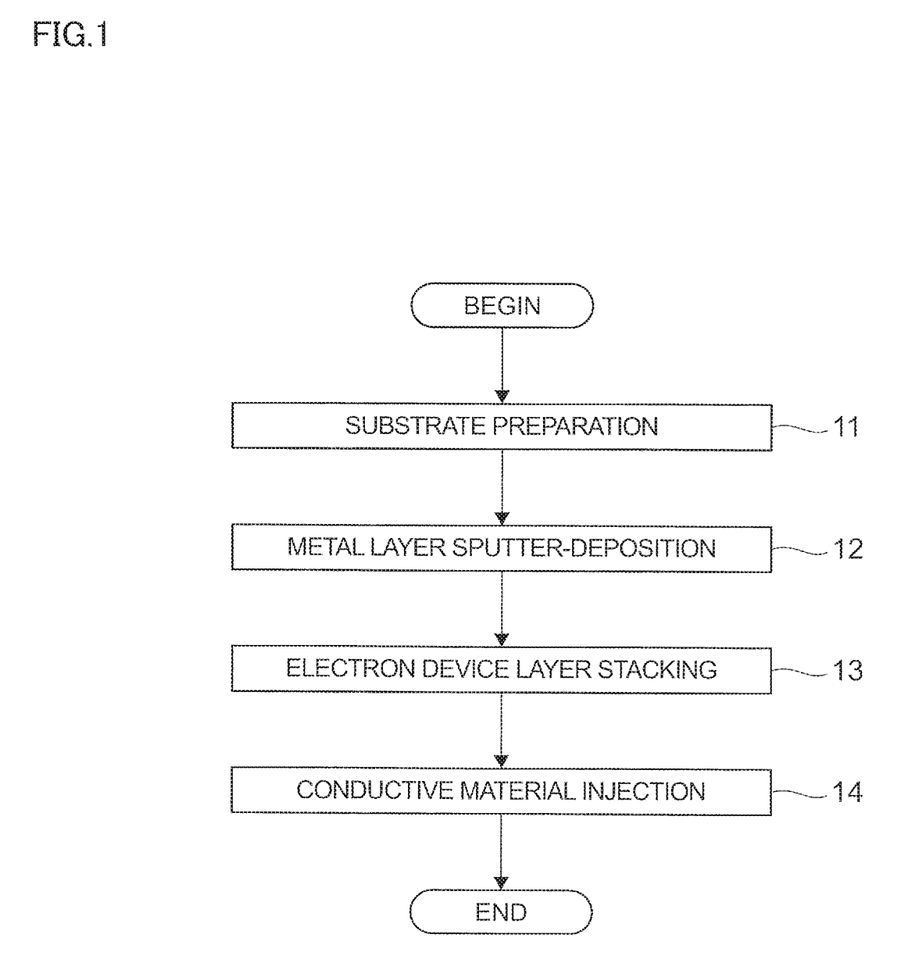
FIG. 1 depicts a flowchart representing an example of a fabrication procedure of an electron device stack structure according to the first exemplary embodiment of the present invention.

Referring to FIG. 1, there is shown a flowchart representing an example of a fabrication procedure of the electron device stack structure according to the first exemplary embodiment. As shown in FIG. 1, the fabrication procedure can include, in time order, a substrate preparation block 11, a metal layer sputter-deposition block 12, an electron device layer stacking block 13, and a conductive material injection block 14.

Referring to FIGS. 2A to 4B, there are shown cross-sectional views and perspective views (except for FIG. 3) of an electron device layer 110 while the blocks 11 and 12 of FIG. 1 are being executed. Note that in each of FIGS. 2A to 4B, only one electron device layer 110 is shown, although plural electron device layers 110 are actually handled in parallel.

Figure 2A:
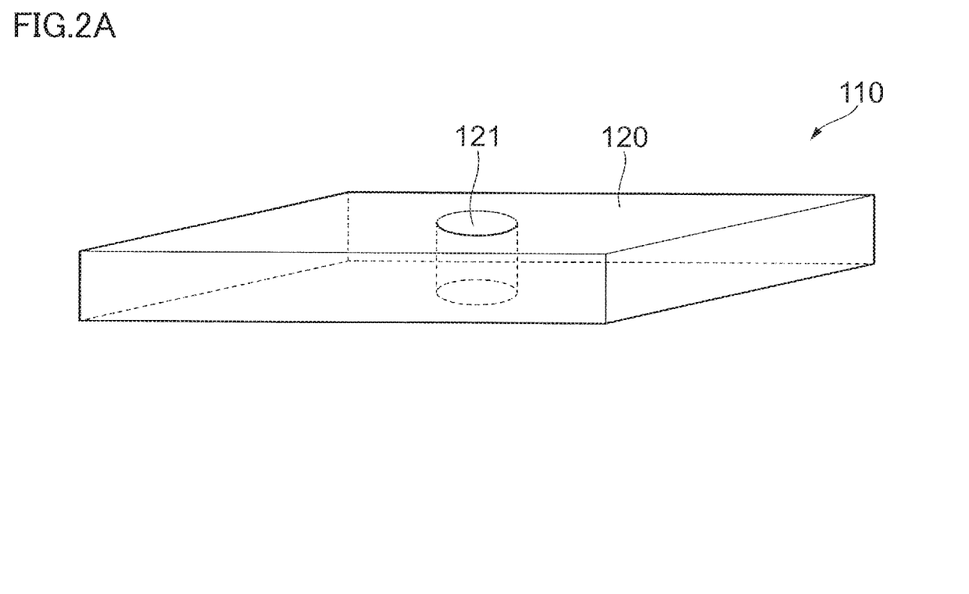
FIGS. 2A and 2B depict a perspective view and a cross-sectional view, respectively, of an electron device layer.
Figure 2B:
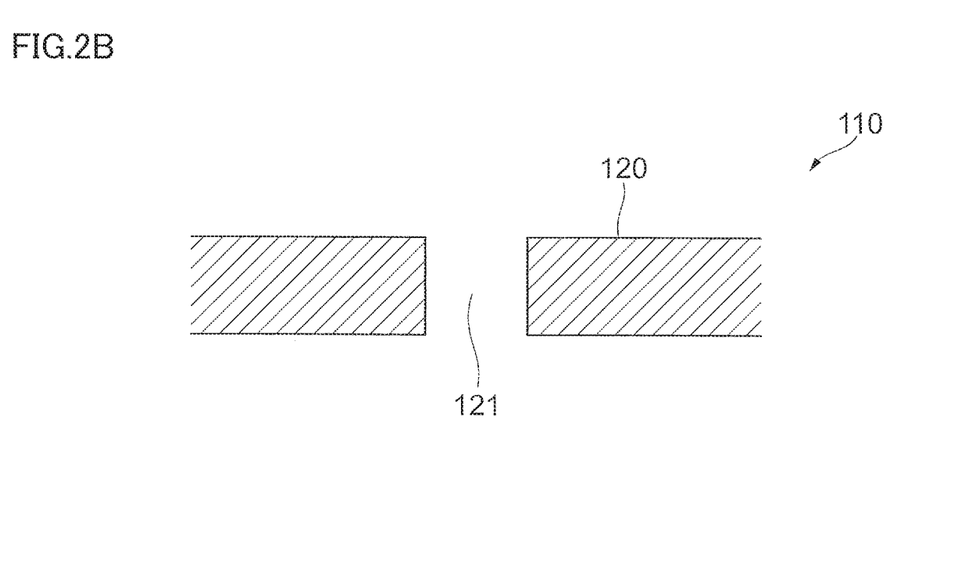

FIGS. 2A and 2B show a perspective view and a cross-sectional view, respectively, of the electron device layer 110 after the substrate preparation block 11 is completed. As shown in FIGS. 2A and 2B, a substrate 120 can be prepared. The substrate 120 can be made of any one of non-conductive substrate materials, such as silicon, alumina ceramic, glass, mica, etc. Further, as shown in FIGS. 2A and 2B, a via 121 can be formed in the substrate 120.

Figure 3:
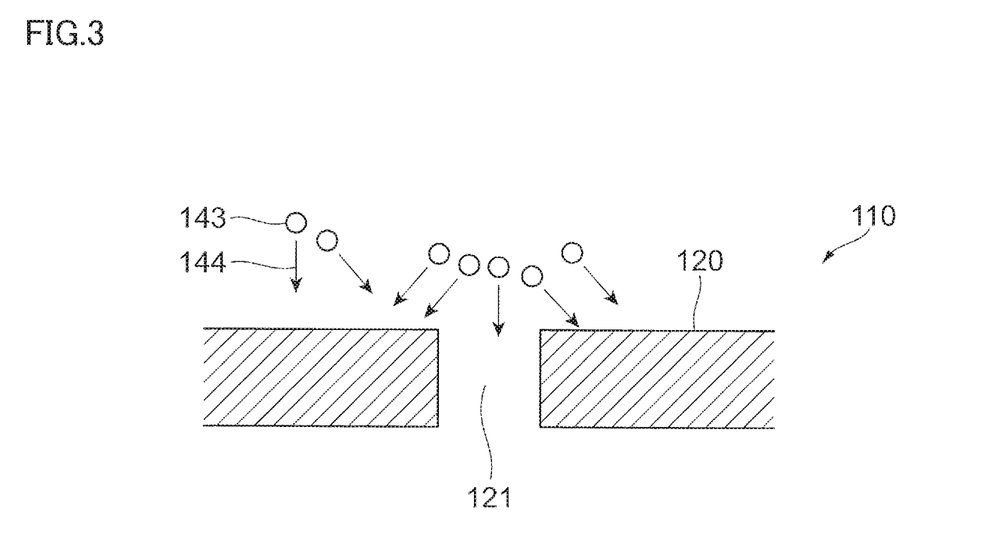
FIG. 3 depicts a cross-sectional view of the electron device layer while a metal layer is deposited by sputter deposition.

FIG. 3 shows a cross-sectional view of the electron device layer 110 while the metal layer sputter-deposition block 12 is being executed. As shown in FIG. 3, metal particles 143 can be sputtered above the substrate 120. As indicated by arrows 144, the metal particles 143 can scatter in various directions. Some metal particles 143 can go towards the surface of the substrate 120, and others can stray into the via 121.

Figure 4A:
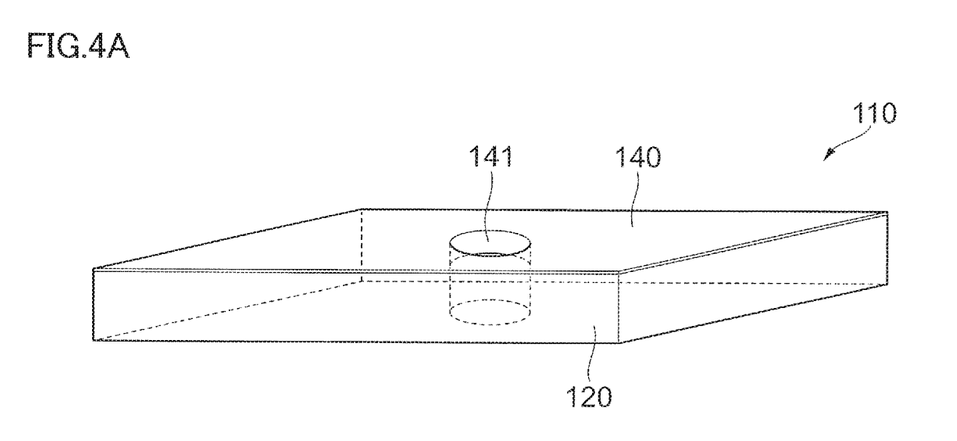
FIGS. 4A and 4B depict a perspective view and a cross-sectional view, respectively, of the electron device layer.
Figure 4B:
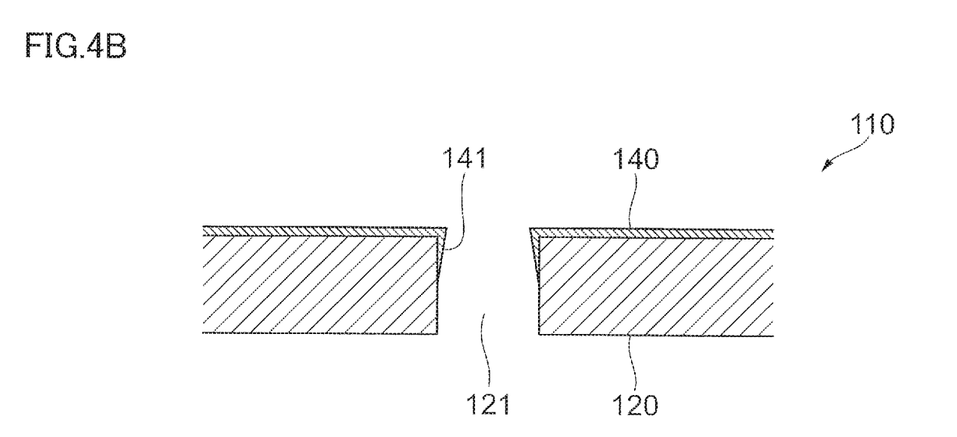

FIGS. 4A and 4B show a perspective view and a cross-sectional view, respectively, of the electron device layer 110 after the metal layer sputter-deposition block 12 is completed. As shown in FIGS. 4A and 4B, a metal layer 140 can be deposited on the substrate 120 by sputtering of the metal particles 143 shown in FIG. 3. Further, a part of the metal layer 140 can stray into the via 121 from its opening and stick to the side wall close to the opening, by straying of some of the metal particles 143 into the via 121 shown in FIG. 3. The part of the metal layer 140 can constitute a stray metal portion 141 functioning as an electrode.

Subsequently, the plural electron device layers 110 each including the substrate 120 and the metal layer 140 can be stacked at the electron device layer stacking block 13. Then, plural vias 121 each formed in the substrates 120 can be connected to form a through via functioning as a conductive path (not shown).

After that, a conductive material can be injected into the conductive path at the conductive material injection block 14. The conductive material can be solder, conductive paste, and the like. Injection molded solder (IMS) can be used for injection of the conductive material. IMS is a technology that forms solder bumps on a substrate such as a wafer by injecting molten solder into holes in a resist mask. IMS can support fine pitches. Thus, a vertical electrical connection among the stray metal portions 141 can be fabricated.

Here, control of a vertical length of the stray metal portion 141 is described. The vertical length of the stray metal portion 141 corresponds to a contact length of an electrode when the stray metal portion 141 functions as the electrode.

Figure 5:
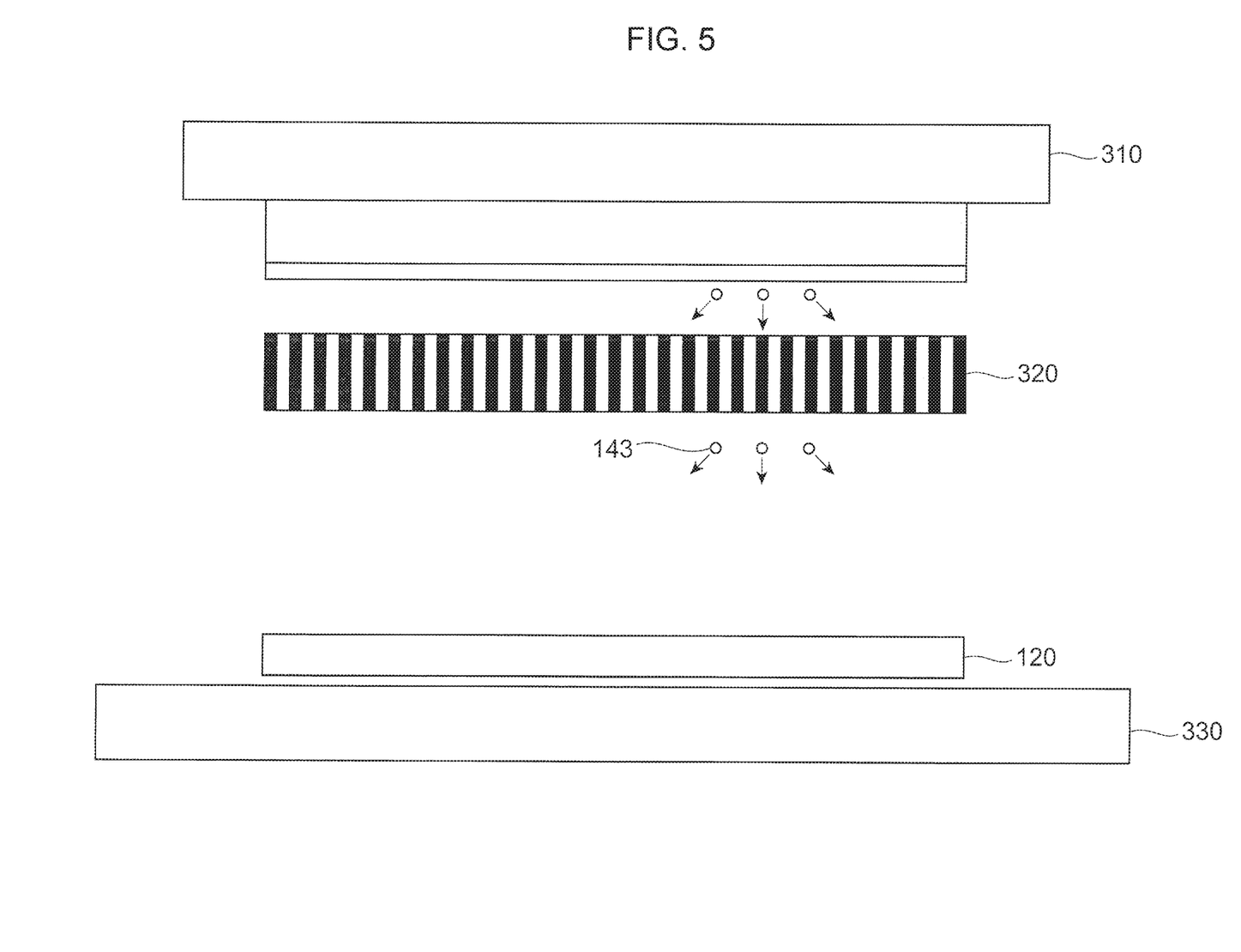
FIG. 5 depicts a mechanism for controlling a vertical length of a stray metal portion.

Referring to FIG. 5, there is shown a mechanism for controlling the vertical length of the stray metal portion 141. As shown in FIG. 5, the mechanism can include a target metal 310, a collimator 320, and a substrate holder 330. Specifically, the substrate 120 can be placed on the substrate holder 330, and the collimator 320 can be placed above the substrate 120. Then, the surface of the target metal 310 can be tapped with plasma. This can cause the metal particles 143 to pop out in all directions from the target metal 310, and the collimator 320 to trap some metal particles 143 which fly laterally. As a result, a distribution of incident angles of the metal particles 143 to the substrate 120 can be narrowed.

Figure 6A:
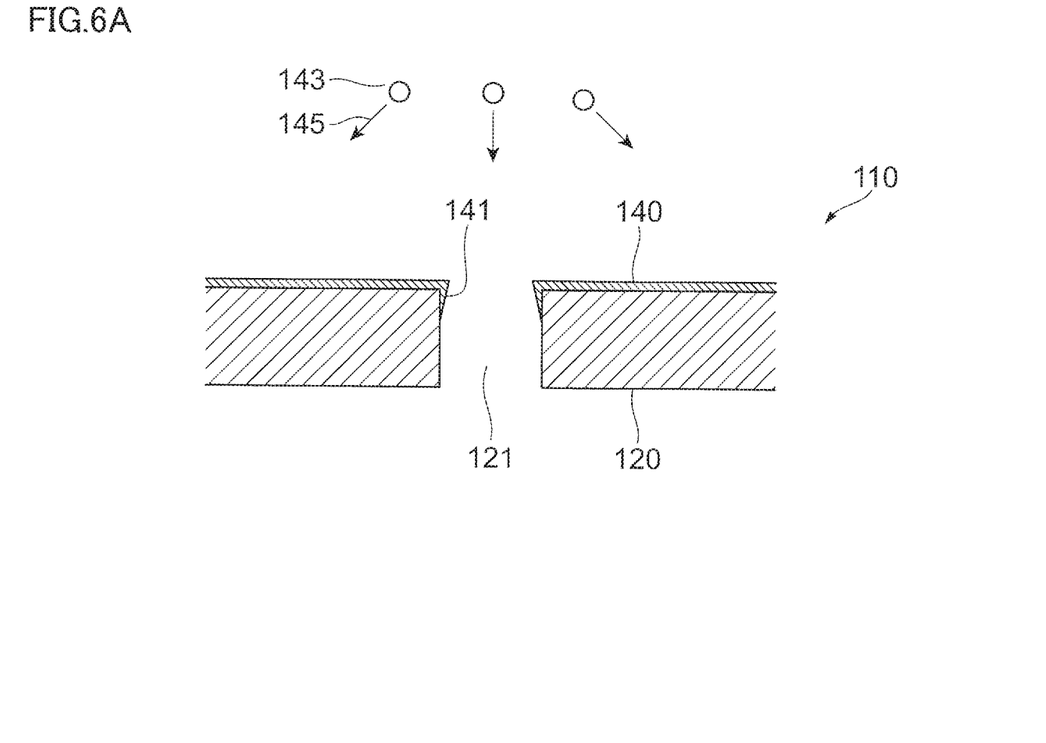
FIGS. 6A and 6B depict cross-sectional views of substrates each with a metal layer indicating a relationship between the vertical length of the stray metal portion and the distribution of incident angles of metal particles.
Figure 6B:
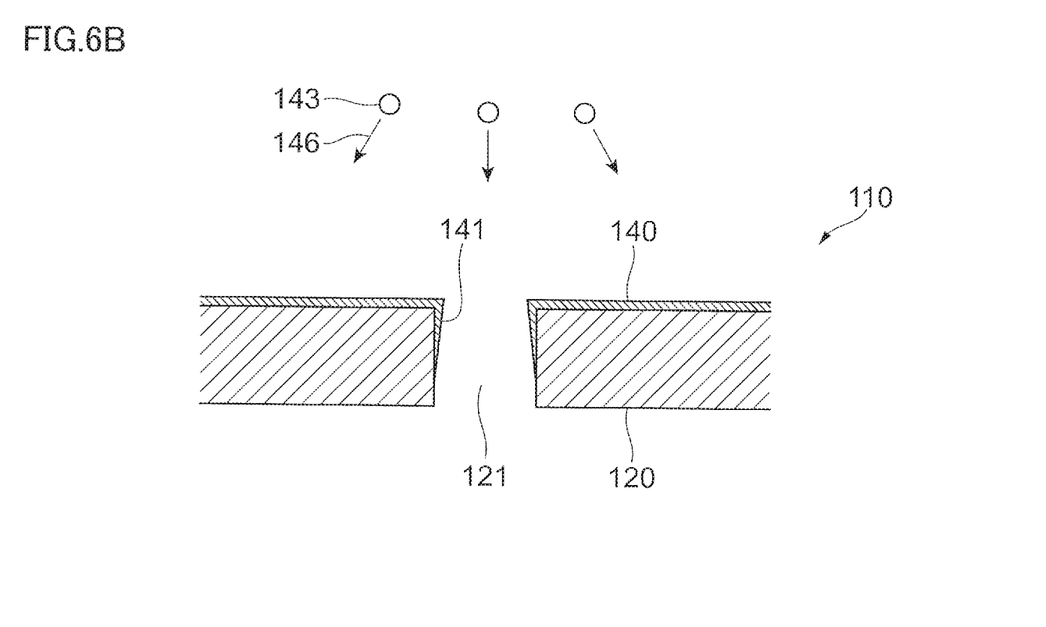

Referring to FIGS. 6A and 6B, there are shown cross-sectional views of the substrates 120 each with a metal layer 140 indicating a relationship between the vertical length of the stray metal portion 141 and the distribution of incident angles of the metal particles 143. FIG. 6A shows a cross-sectional view of the substrate 120 with the metal layer 140 in a case where the distribution of the incident angles of the metal particles 143 is wider, as indicated by arrows 145. FIG. 6B shows a cross-sectional view of the substrate 120 with the metal layer 140 in a case where the distribution of the incident angles of the metal particles 143 is narrower, as indicated by arrows 146. In FIG. 6A, a ratio of the side surface of the substrate 120 covered with the stray metal portion 141 to the top surface of the substrate 120 covered with the metal layer 140 can be lower. Thus, the vertical length of the stray metal portion 141 can be shorter. In other words, the stray depth of the stray metal portion 141 can be shallower. On the other hand, in FIG. 6B, a ratio of the side surface of the substrate 120 covered with the stray metal portion 141 to the top surface of the substrate 120 covered with the metal layer 140 can be higher. Thus, the vertical length of the stray metal portion 141 can be longer. In other words, the stray depth of the stray metal portion 141 can be deeper.

Next, an explanation is given of the case where the present exemplary embodiment is applied particularly to a battery stack structure (e.g., a solid thin film battery stack structure), as the second exemplary embodiment.

Figure 7:
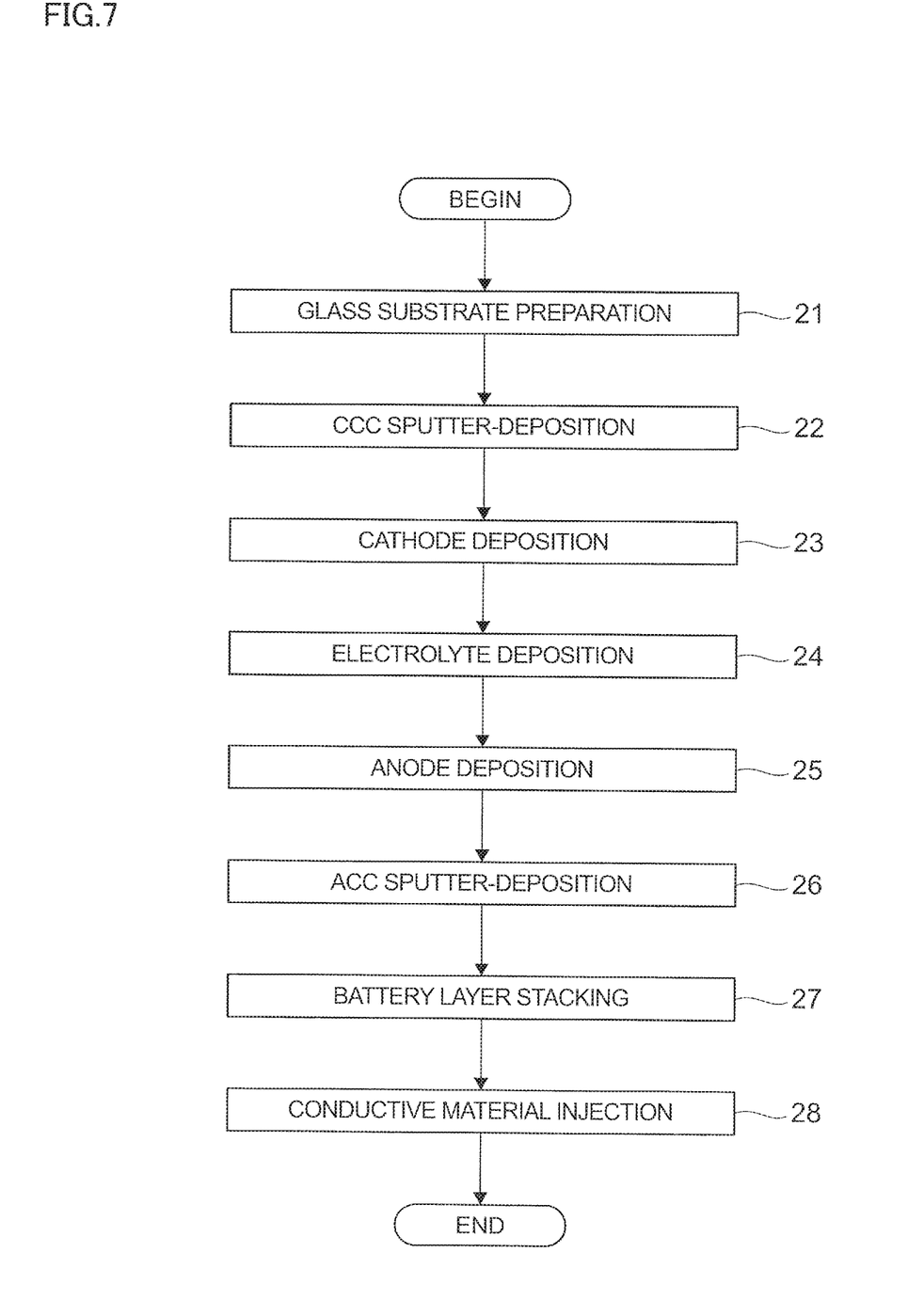
FIG. 7 depicts a flowchart representing an example of a fabrication procedure of a battery stack structure according to the second exemplary embodiment.

Referring to FIG. 7, there is shown a flowchart representing an example of a fabrication procedure of the battery stack structure according to the second exemplary embodiment. As shown in FIG. 7, the fabrication procedure can include, in time order, a glass substrate preparation block 21, a cathode current collector (CCC) sputter-deposition block 22, a cathode deposition block 23, an electrolyte deposition block 24, an anode deposition block 25, an anode current collector (ACC) sputter-deposition block 26, a battery layer stacking block 27, and a conductive material injection block 28.

Referring to FIGS. 8A to 8J, there are shown cross-sectional views of a battery layer 210 while the blocks 21 to 26 of FIG. 7 are being executed. Note that in each of FIGS. 8A to 8J, only one battery layer 210 is shown, although plural battery layers 210 are actually handled in parallel.

Figure 8A:
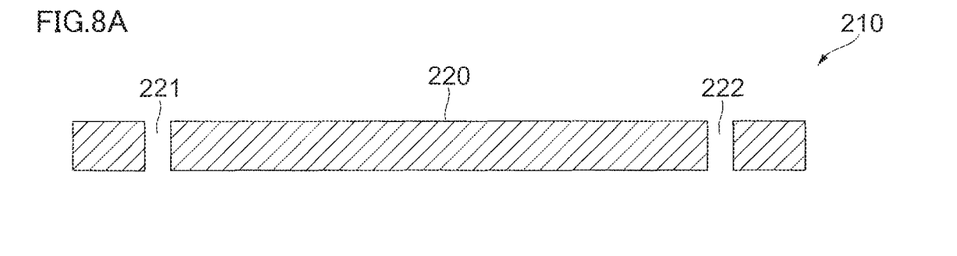
FIGS. 8A, 8B, 8C, 8D, 8E, 8F, 8G, 8H, 8I and 8J depict cross-sectional views of a battery layer while battery layer fabrication blocks are being executed.

FIG. 8A shows a cross-sectional view of the battery layer 210 after the glass substrate preparation block 21 is completed. As shown in FIG. 8A, a glass substrate 220 can be prepared. In the second exemplary embodiment, the glass substrate 220 is selected to be used from among non-conductive substrates, since glass can easily be drilled by etching technique. Further, as shown in FIG. 8A, vias 221 and 222 can be formed in the glass substrate 220.

Figure 8B:
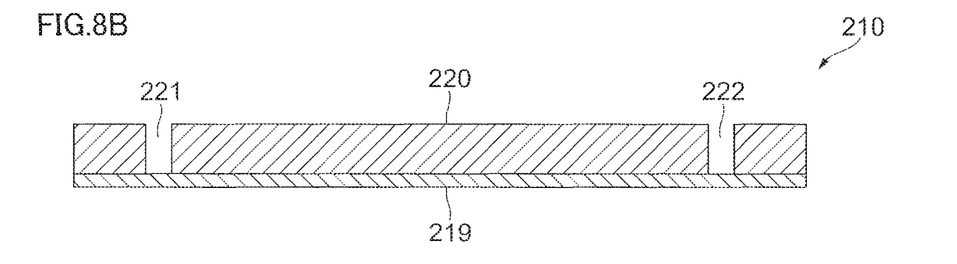

FIG. 8B shows a cross-sectional view of the battery layer 210 before the CCC sputter-deposition block 22 is executed. As shown in FIG. 8B, a support tape 219 can be attached to the undersurface of the glass substrate 220. The support tape 219 can be used to reduce a risk of cracking of the glass substrate 220, which is so thin that the vias 221 and 222 are formed easily.

Figure 8C:
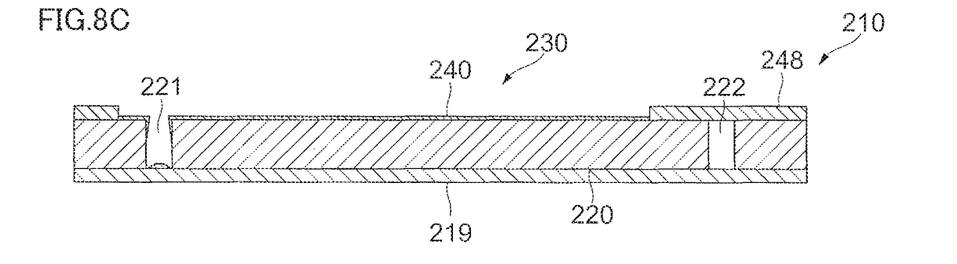

FIG. 8C shows a cross-sectional view of the battery layer 210 while the CCC sputter-deposition block 22 is being executed. As shown in FIG. 8C, a cathode current collector 240 can be deposited as one of battery elements 230 on the glass substrate 220. Since the via 222 is covered with a metal mask 248, the cathode current collector 240 can be deposited on the surface other than a region near the opening of the via 222. The cathode current collector 240 can be made of any one metal (e.g., Cu, Pt, Al, Au, etc.) and other conductive materials (e.g., graphite, carbon nanotube, silicon, etc.) as long as it is adequate for material of a cathode 250 (described later with reference to FIG. 8E). The material of the cathode current collector 240 can be deposited by using deposition technique such as sputtering and vapor deposition.

Figure 8D:
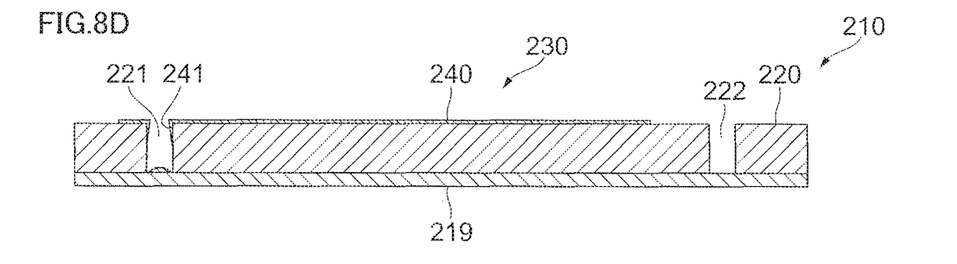

FIG. 8D shows a cross-sectional view of the battery layer 210 after the CCC sputter-deposition block 22 is completed. As shown in FIG. 8D, a stray metal portion 241 of the cathode current collector 240 can be fabricated in the via 221. The stray metal portion 241 can be a part of the cathode current collector 240 which has been strayed into the via 221 from its opening and has been stuck to the side wall close to the opening. Further, the metal mask 248 can be removed temporarily.

Figure 8E:
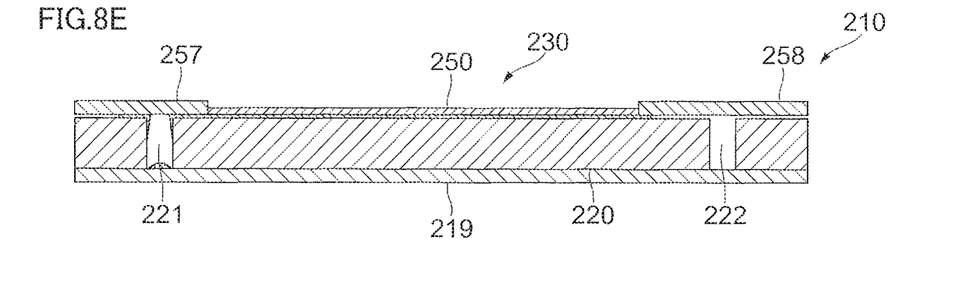

FIG. 8E shows a cross-sectional view of the battery layer 210 while the first stage of the cathode deposition block 23 is being executed. As shown in FIG. 8E, a cathode 250 can be deposited as one of the battery elements 230 on the cathode current collector 240. Since the vias 221 and 222 are covered with metal masks 257 and 258, respectively, the cathode 250 can be deposited on the surface other than regions near either of the opening of the via 221 or the opening of the via 222. The cathode 250 can be made of crystalline or nano-crystalline lithium intercalation compounds such as $LiCoO_2$, $LiMn_2O_4$, etc. The material of the cathode 250 can be deposited by using deposition technique such as sputtering. Alternatively, the material of the cathode 250 can be deposited by using vapor deposition technique while heating the substrate 220 at a predetermined deposition temperature in a range of 500-700 degrees Celsius.

Figure 8F:
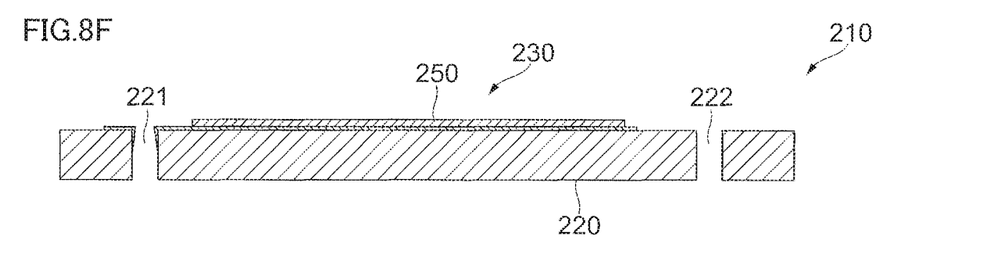

FIG. 8F shows a cross-sectional view of the battery layer 210 while the second stage of the cathode deposition block 23 is being executed. As shown in FIG. 8F, the support tape 219 can be removed temporarily. Then, the cathode 250 can be annealed at a predetermined annealing temperature in a range of 500-700 degrees Celsius to obtain fully crystalline phases. Note that, since the support tape 219 cannot withstand the annealing temperature, the support tape 219 can be removed temporarily, as stated above. Further, the metal masks 257 and 258 can also be removed temporarily.

Figure 8G:
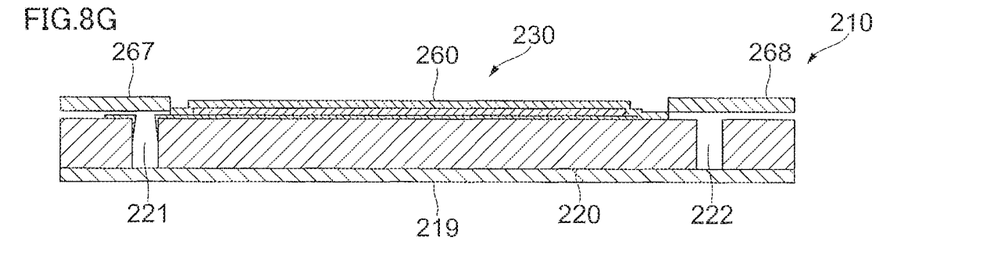

FIG. 8G shows a cross-sectional view of the battery layer 210 while the electrolyte deposition block 24 is being executed. As shown in FIG. 8G, the support tape 219 can be attached to the undersurface of the glass substrate 220, and an electrolyte 260 can be deposited as one of the battery elements 230 on the cathode 250. Since the vias 221 and 222 are covered with the metal masks 267 and 268, respectively, the electrolyte 260 can be deposited on the surface other than regions near either of the opening of the via 221 or the opening of the via 222. The electrolyte 260 can include solid electrolytes such as ceramic electrolyte including lithium oxide based electrolytes (e.g., lithium phosphorus oxynitride (LiPON), lithium lanthanum titanium oxide (LLTO), etc.), lithium sulfide based electrolytes and other lithium phosphate based electrolytes (e.g., lithium borophosphate (LiBP), etc.). The LiPON can be preferably used for the electrolyte 260 since it has a preferable ionic conductivity and electrochemical stability. The electrolyte 260 can be deposited by using deposition technique such as sputtering and vapor deposition.

Figure 8H:
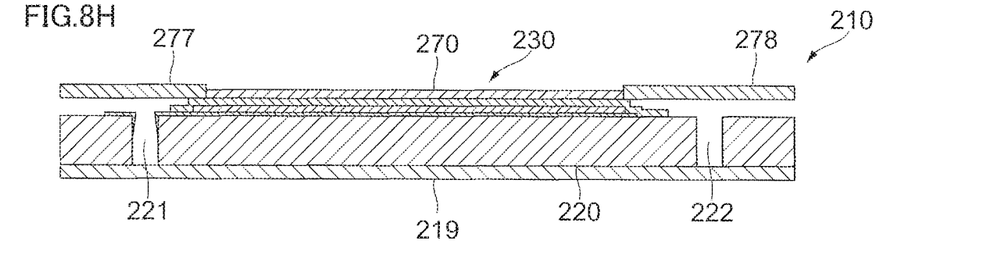

FIG. 8H shows a cross-sectional view of the battery layer 210 while the anode deposition block 25 is being executed. As shown in FIG. 8H, an anode 270 can be deposited as one of the battery elements 230 on the electrolyte 260. Since the vias 221 and 222 are covered with the metal masks 277 and 278, respectively, the anode 270 can be deposited on the surface other than regions near either of the opening of the via 221 or the opening of the via 222. The anode 270 can include silicon and/or materials that have a melting point higher than a curing temperature of an insulator 290 (described later with reference to FIGS. 9A to 9E). Specifically, the anode 270 can be a Li-free anode, in which the anode 270 is formed by electroplating of metallic lithium or lithiation at the interface between the electrolyte 260 and an anode current collector 280 (described later) upon the initial charge. Alternatively, the anode 270 can be a Li-ion anode such as silicon tin oxynitride (SiTON), tin and zinc nitrides. The material of the anode 270 can be deposited by using deposition technique such as sputtering and vapor deposition.

Figure 8I:
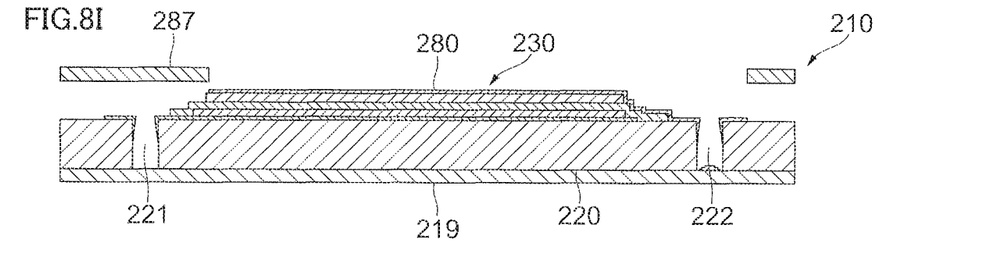

FIG. 8I shows a cross-sectional view of the battery layer 210 while the ACC sputter-deposition block 26 is being executed. As shown in FIG. 8I, an anode current collector 280 can be deposited as one of the battery elements 230 on the anode 270. Since the via 221 is covered with a metal mask 287, the anode current collector 280 can be deposited on the surface other than a region near the opening of the via 221. The anode current collector 280 can be made of any one metal (e.g., Cu, Pt, Al, Au, etc.) and other conductive materials (e.g., graphite, carbon nanotube, silicon, etc.) as long as it is adequate for material of the anode 270. The material of the anode current collector 280 can be deposited by using deposition technique such as sputtering and vapor deposition.

Figure 8J:
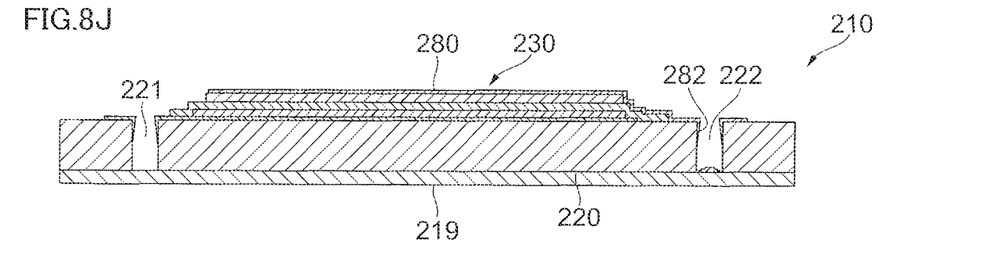

FIG. 8J shows a cross-sectional view of the battery layer 210 after the ACC sputter-deposition block 26 is completed. As shown in FIG. 8J, a stray metal portion 282 of the anode current collector 280 can be fabricated in the via 222. The stray metal portion 282 can be a part of the anode current collector 280 which has been strayed into the via 222 from its opening and has been stuck to the side wall close to the opening. Further, the metal mask 287 can be removed temporarily.

Figure 9A:
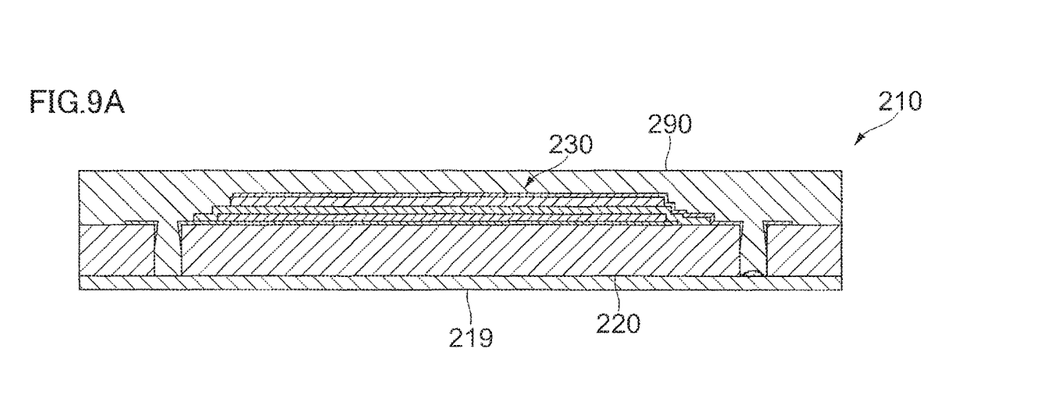
FIGS. 9A, 9B, 9C, 9D and 9E depict cross-sectional views of the battery layer or a battery stack structure.
Figure 9B:
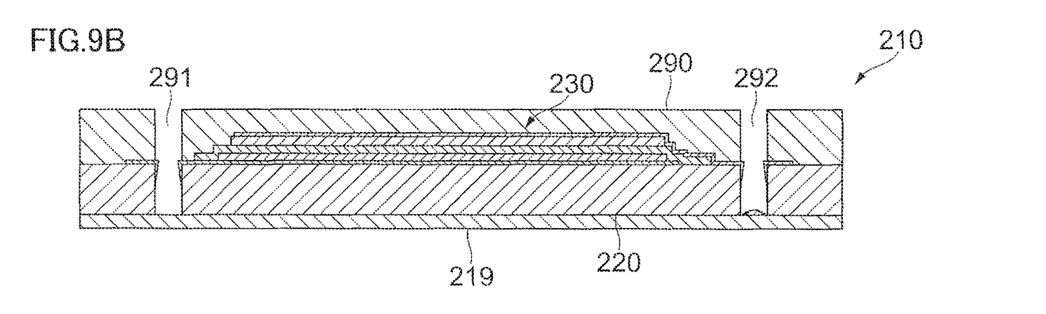
Figure 9C:
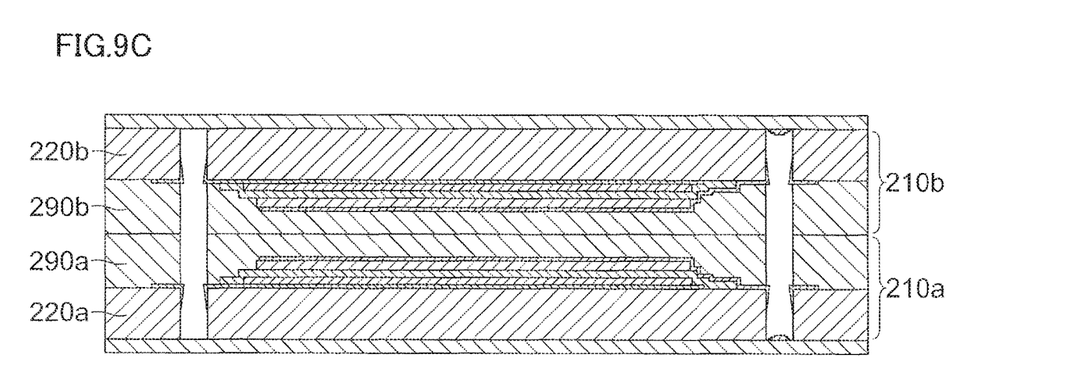
Figure 9D:
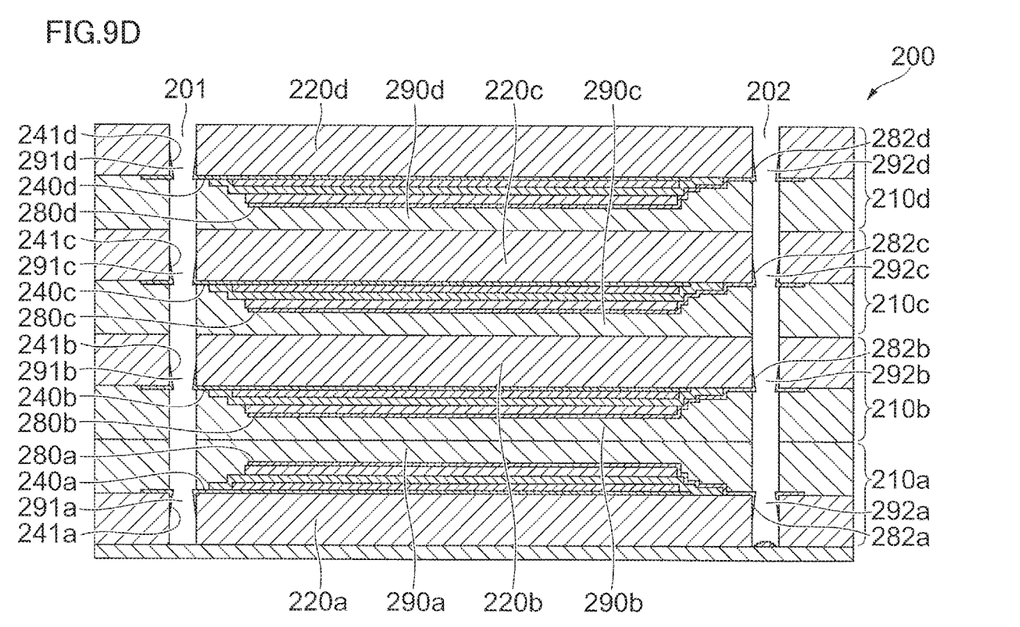
Figure 9E:
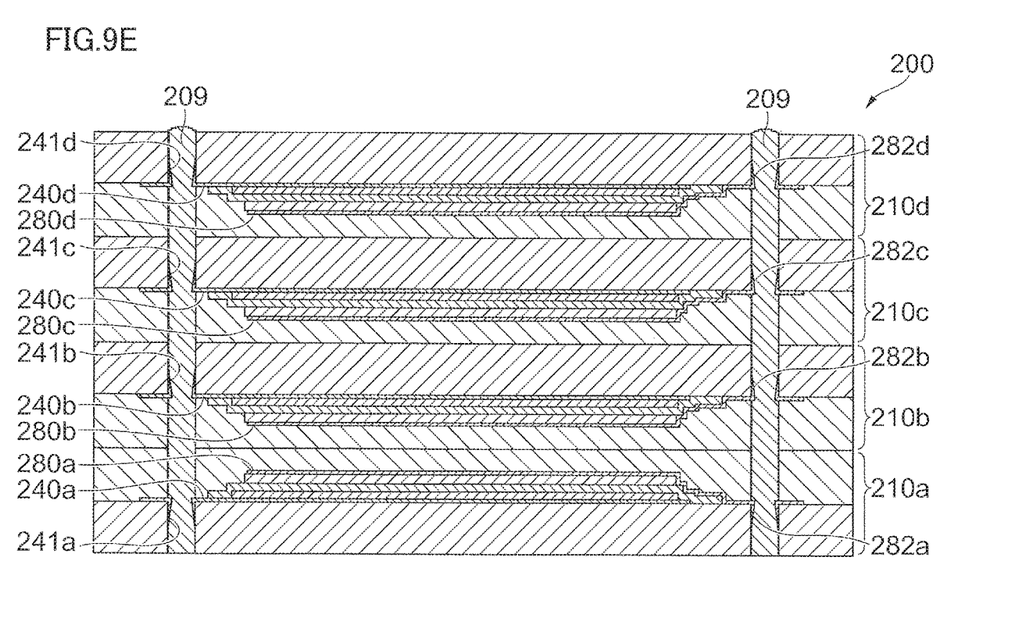

Referring to FIGS. 9A to 9E, there are shown cross-sectional views of the battery layer 210 or a battery stack structure 200 while the blocks 27 and 28 of FIG. 7 are being executed. Note that in each of FIGS. 9A and 9B, only one battery layer 210 is shown, although plural battery layers 210 are actually handled in parallel. In FIGS. 9C to 9E, the battery stack structure 200 is assumed to have four battery layers 210a to 210d. However, the number of the battery layers 210 may not be limited to the specific embodiment shown in FIGS. 9C to 9E. In other embodiments, more than four battery layers can be stacked to form the battery stack structure 200.

FIG. 9A shows a cross-sectional view of the battery layer 210 while the first stage of the battery layer stacking block 27 is being executed. As shown in FIG. 9A, the glass substrate 220 and the battery elements 230 can be coated with an insulator 290 to form the battery layer 210. The insulator 290 can be made from a resin, which can have a predetermined curing temperature in a range of 50-350 degrees Celsius, more preferably 150-250 degrees Celsius. Photosensitive adhesive, such as BCB (benzocyclobutene) resin, etc., can be used for the insulator 290. Other laser-processable insulator materials that can be drilled by a laser can be also used for the insulator 290 instead of the photosensitive adhesive.

FIG. 9B shows a cross-sectional view of the battery layer 210 while the second stage of the battery layer stacking block 27 is being executed. As shown in FIG. 9B, vias 291 and 292 can be formed in the battery layer 210. The vias 291 and 292 can be opened by using technique such as photolithography, laser processing, etc. For example, the resin of photolithographed via-locations can be removed from the insulator 290 to open the vias 291 and 292 into the insulator 290.

FIG. 9C shows a cross-sectional view of the battery layers 210 while the third stage of the battery layer stacking block 27 is being executed. As shown in FIG. 9C, battery layers 210a and 210b, formed on substrates 220a and 220b, respectively, can be stacked. In FIG. 9C, the battery layers 210a and 210b are stacked so that the insulators 290a and 290b are attached face-to-face. By curing the material of the insulators 290a and 290b, the flat surface of the insulator 290a and the flat surface of the insulator 290b are rigidly fixed to each other.

FIG. 9D shows a cross-sectional view of the battery stack structure 200 after the battery layer stacking block 27 is completed. As shown in FIG. 9D, the battery stack structure 200 can be formed by stacking battery layers 210c and 210d on a combination of the battery layers 210a and 210b. In FIG. 9D, the battery layers 210c and 210d are stacked face-down. By curing the material of the insulator 290c, the flat surface of the glass substrate 220b and the flat surface of the insulator 290c are rigidly fixed to each other. By curing the material of the insulator 290d, the flat surface of the glass substrate 220c and the flat surface of the insulator 290d are rigidly fixed to each other. Further, as shown in FIG. 9D, vias 291a to 291d can be connected to form a through via 201, and vias 292a to 292d can be connected to form a through via 202. The through vias 201 and 202 can be formed to provide a conductive path between an external device and the battery elements 230. The through via 201 can be contacted at stray metal portions 241a to 241d of cathode current collectors 240a to 240d. The through via 202 can be contacted at stray metal portions 282a to 282d of anode current collectors 280a to 280d. In the embodiment shown in FIG. 9D the battery layers 210a to 210d are stacked such that the outside surfaces are formed by substrate 220a on a first (bottom) side and substrate 220d on a second (top) side.

Note that, although the battery layers 210a and 210b are stacked face-to-face and the battery layers 210c and 210d are stacked face-down in this example, the way of stacking the battery layers 210a to 210d is not limited to this. All of the battery layers 210a to 210d can be stacked face-down.

FIG. 9E shows a cross-sectional view of the battery stack structure 200 after the conductive material injection block 28 is completed. As shown in FIG. 9E, a conductive material 209 can be injected into the through vias 201 and 202. The conductive material can be solder, conductive paste, and the like. Injection molded solder (IMS) can be used for injection of the conductive material. Thus, a vertical electrical connection among the stray metal portions 241a to 241d, and a vertical electrical connection among the stray metal portions 282a to 282d can be fabricated.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating an electron device stack structure, the method comprising:
preparing a plurality of substrates each having a corresponding one of a plurality of vias;
sputter-depositing a plurality of metal layers on the plurality of substrates to form a plurality of electron device layers, each of the plurality of metal layers being sputter-deposited on a corresponding one of the plurality of substrates and including a part straying into the corresponding one of the plurality of vias as a corresponding one of a plurality of stray metal portions;
stacking the plurality of electron device layers to form the electron device stack structure having a conductive path formed by connecting the plurality of vias; and
injecting a conductive material into the conductive path to form a vertical electrical connection among the plurality of stray metal portions.

2. The method of claim 1, wherein sputter-depositing the plurality of metal layers comprises controlling stray depths of the plurality of stray metal portions, using a collimator.

3. The method of claim 1, wherein injecting the conductive material comprises utilizing injection molded solder (IMS).

4. The method of claim 1, wherein:
the plurality of electron device layers include a plurality of battery layers, and
the plurality of metal layers include a plurality of cathode current collectors and a plurality of anode current collectors.

5. The method of claim 4, further comprising depositing a plurality of sets of battery elements between the plurality of cathode current collectors and the plurality of anode current collectors, wherein:
each of the plurality of sets of battery elements is deposited between a corresponding one of the plurality of cathode current collectors and a corresponding one of the plurality of anode current collectors, and
each of the plurality of sets of battery elements is a set of a cathode coupled to the corresponding one of the plurality of cathode current collectors, an electrolyte, and an anode coupled to the corresponding one of the plurality of anode current collectors.

6. An electron device stack structure, comprising:
a plurality of substrates each having a corresponding one of a plurality of vias;
a plurality of metal layers deposited on the plurality of substrates to form a plurality of electron device layers, each of the plurality of metal layers being deposited on a corresponding one of the plurality of substrates and including a part straying into the corresponding one of the plurality of vias as a corresponding one of a plurality of stray metal portions, the plurality of electron device layers being stacked to form the electron device stack structure having a conductive path formed by connecting the plurality of vias; and
a conductive material injected into the conductive path to form a vertical electrical connection among the plurality of stray metal portions.

7. The electron device stack structure of claim 6, wherein:
the plurality of electron device layers include a plurality of battery layers, and
the plurality of metal layers include a plurality of cathode current collectors and a plurality of anode current collectors.

8. The electron device stack structure of claim 7, further comprising a plurality of sets of battery elements deposited between the plurality of cathode current collectors and the plurality of anode current collectors, wherein:
each of the plurality of sets of battery elements is deposited between a corresponding one of the plurality of cathode current collectors and a corresponding one of the plurality of anode current collectors, and
each of the plurality of sets of battery elements is a set of a cathode coupled to the corresponding one of the plurality of cathode current collectors, an electrolyte, and an anode coupled to the corresponding one of the plurality of anode current collectors.

* * * * *